(12) United States Patent
Yang et al.

(10) Patent No.: US 7,034,388 B2
(45) Date of Patent: Apr. 25, 2006

(54) STACK TYPE FLIP-CHIP PACKAGE

(75) Inventors: Chaur-Chin Yang, Kaohsiung (TW);
Hsueh-Te Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 86 days.

(21) Appl. No.: 10/869,464

(22) Filed: Jun. 15, 2004

(65) Prior Publication Data

US 2004/0251531 A1  Dec. 16, 2004

Related U.S. Application Data

(63) Continuation-in-part of application No. 10/128,719, filed on Apr. 23, 2002, now Pat. No. 6,768,190.

(30) Foreign Application Priority Data

Jan. 25, 2002 (TW) .............................. 91101229 A (51) Int. Cl.
*H01L 23/02* (2006.01)
(52) U.S. Cl. ...................... 257/686; 257/712; 257/778; 257/796
(58) Field of Classification Search ................ 257/685, 257/686, 712, 723, 773, 777, 778, 784, 787, 257/796
See application file for complete search history.

(56) References Cited

U.S. PATENT DOCUMENTS

| | | | |
|---|---|---|---|
| 5,994,166 A * | 11/1999 | Akram et al. ................ | 438/108 |
| 6,404,062 B1 * | 6/2002 | Taniguchi et al. .......... | 257/778 |
| 6,563,206 B1 * | 5/2003 | Kamikuri et al. ........... | 257/686 |
| 6,577,008 B1 * | 6/2003 | Lam et al. ................... | 257/750 |

* cited by examiner

*Primary Examiner*—Hoai Pham
*Assistant Examiner*—DiLinh Nguyen
(74) *Attorney, Agent, or Firm*—J.C. Patents (57) ABSTRACT

A stack type flip-chip package is described, including a substrate board, a first chip, a second chip, a packaging material and a heat sink. The substrate board has bump contacts and line contacts thereon, wherein the bump contacts connect with the bonding pads on the active surface of the first chip via bumps. The back surface of the first chip has a redistribution circuit thereon including bump pads and line pads exposed by a passivation layer, wherein the bump pads connect with the bonding pads of the second chip via bumps, and the line pads are connected to the line contacts via conductive wires. The packaging material encloses the first chip and the conductive wires, but may expose the back surface of the second chip, to which a heat sink can be directly bonded.

20 Claims, 6 Drawing Sheets

STACK TYPE FLIP-CHIP PACKAGE

CROSS-REFERENCE TO RELATED APPLICATION

This application is a continuation-in-part (CIP) application of U.S. patent application Ser. No. 10/128,719 filed Apr. 23, 2002 now U.S. Pat. No. 6,768,190, which claims the priority benefit of Taiwan Patent Application Serial No. 091101229 filed Jan. 25, 2002.

BACKGROUND OF THE INVENTION

1. Field of the Invention

The present invention relates to a stack type flip-chip package. More particularly, the present invention relates to a stack type flip-chip package having a redistribution circuit on the back surface of a chip to serve as an electrical bridge for an upper chip.

2. Description of Related Art

To form a flip-chip package, a silicon chip having an active surface with many bonding pads thereon is provided. Each bonding pad is formed with a bump thereon, so that the chip can be flipped over and attached to the contact points on a package carrier. In general, a flip-chip package occupies a small area and has a high packaging density. Moreover, direct electrical connection through bumps reduces signal transmission path. Therefore, flip-chip designs are employed in chip scale packages (CSP), ball grid array (BGA) packages and multi-chip module (MCM). Note that a number of chips each having a different function can be enclosed within a single package to form a multi-chip module, which not only reduces the package volume and area, but also shortens the transmission path between chips. Consequently, the overall performance is improved.

To form a conventional multi-chip package, both flip-chip technique and chip stacking designs are employed so that two or more chips each having a different function are enclosed within a single package. As before, combining the flip-chip technique with a stacking design not only reduces the package area and increases the packing density, but also shortens the signal transmission length and improves the overall performance.

Figure 1:
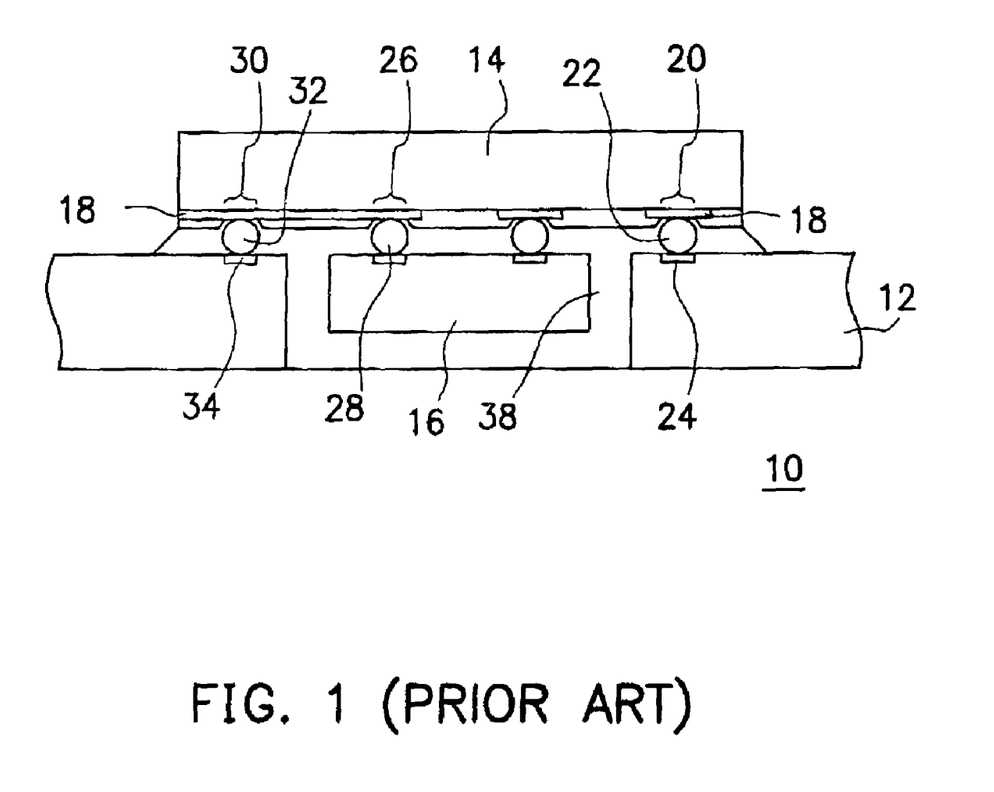
FIG. 1 is a schematic cross-sectional view of a conventional stack type flip-chip package.

FIG. 1 is a schematic cross-sectional view of a conventional stack type flip-chip package. As shown in FIG. 1, the stack type flip-chip package 10 uses both the flip-chip technique and a stacking design such that an upper chip 14 and a lower chip 16 are packaged inside a substrate board 12. The upper chip 14 has a redistribution line 18. The redistribution line 18 not only provides a bonding pad 20 for connecting with a contact pad 24 on the substrate board 12 through a bump 22, but also provides another bonding pad 26 for connecting with a bump 28 on the lower chip 16. In addition, the bonding pad 26 also fans out to yet another bonding pad 30. The bonding pad 30 connects with a contact pad 34 on the substrate board 12 through a bump 32 so that the lower chip 16 and the substrate board 12 are electrically connected. To accommodate the lower chip 16, the substrate board 12 has an opening (or cavity) therein. The package also requires injection of some underfill material 38. The underfill material 38 fills up the space between the substrate board 12, the upper chip 14 and the lower chip 16 to protect the bumps, bonding pads and contact pads against shock and vibrations.

The aforementioned stack type flip-chip package design has the following drawbacks. The upper chip must provide sufficient number of bonding pads for connecting with the bumps on the lower chip. Hence, the usable area on the upper chip is greatly reduced and the bonding pad arrangement on the upper chip is severely limited. Moreover, the gaps between the substrate board and the upper and lower chip on one hand and between the upper and lower chip on the other hand are small and unevenly distributed. Thus, filling up all the space within the package with underfill material is difficult.

SUMMARY OF THE INVENTION

Accordingly, one object of the present invention is to provide a multi-chip module having a stack type flip-chip design for accommodating two or more chips each having a different function inside a single package, thereby reducing overall production cost.

To achieve these and other advantages and in accordance with the purpose of the invention, as embodied and broadly described herein, the invention provides a stack type flip-chip package. The package includes a substrate board, a first chip, a second chip, multiple bumps and conductive wires, and a packaging material. One surface of the substrate board has multiple bump contacts and line contacts thereon. The first chip is disposed on the substrate board, and has an active surface with first bonding pads thereon. The back surface of the first chip is disposed with a redistribution circuit and a passivation layer, wherein the redistribution circuit includes multiple bump pads and line pads exposed by the passivation layer. The second chip is disposed on the first chip, and has a back surface and an active surface with second bonding pads thereon facing the first chip. Bumps are positioned between the bump contacts and the first bonding pads and between the bump pads and the second bonding pads, and the conductive wires connect the line contacts and the line pads. The packaging material may enclose the first chip, the second chip and the conductive wires. In addition, a heat sink can be bonded to the packaging material covering the back surface of the second chip.

Alternatively, the packaging material may merely enclose the first chip and the conductive wires but expose the back surface of the second chip, so that a heat sink can be directly bonded to the back surface of the second chip to facilitate thermal dissipation.

Moreover, the above stack type flip-chip package may further include one or more chips of higher level(s), each of which is connected to a redistribution circuit disposed on the back surface of an underlying chip as described above. Similarly, the packaging material may enclose all chips in the package, or expose the back surface of the upmost chip so that a heat sink can be directly bonded thereto to facilitate thermal dissipation.

Furthermore, there can be more than one second chips disposed on the first chip. In some embodiments, the second chips are all disposed with their active surfaces facing the first chip and connected to the bump pads in the redistribution circuit via bumps. Similarly, the packaging material may enclose all second chips, or expose the back surfaces of all second chips so that a heat sink can be directly bonded to the surfaces of the second chips to facilitate thermal dissipation.

In other embodiments where more than one second chips are included, at least one second chip is disposed with its back surface facing the first chip and each of the rest of the second chips with its active surface facing the first chip as described above. The packaging material may enclose all second chips, or expose a portion of the active surface of the at least one second chip and the back surface of each of the rest of the second chips so that heat sinks can be directly bonded to the surfaces of the second chips.

It is to be understood that both the foregoing general description and the following detailed description are exemplary, and are intended to provide further explanation of the invention as claimed.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
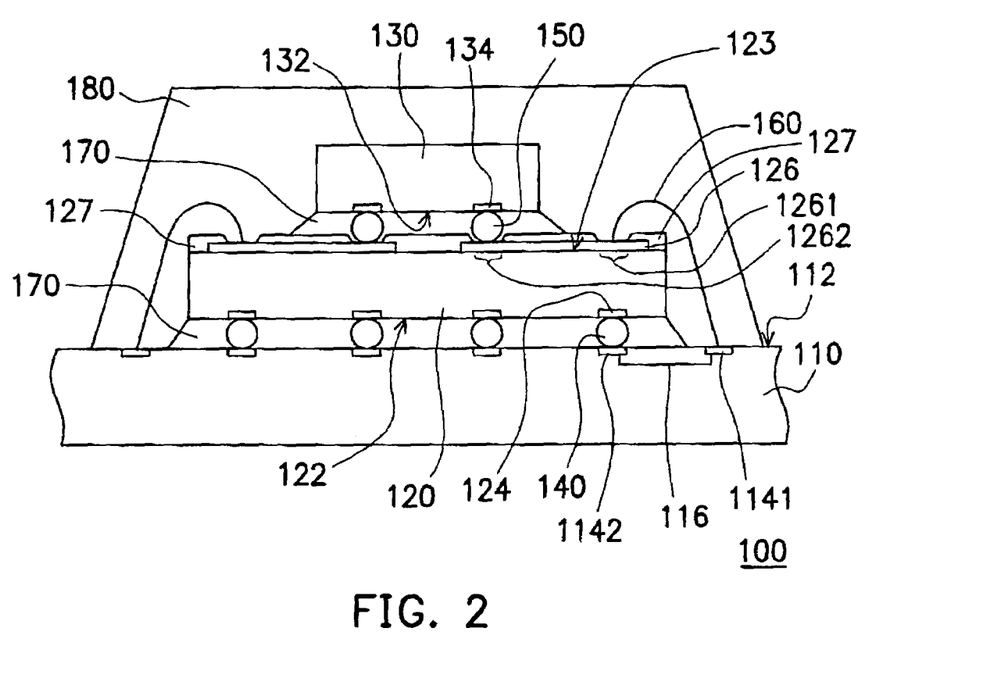
FIG. 2 is a schematic cross-sectional view of a stack type flip-chip package according to a first embodiment of this invention.

FIG. 2 is a schematic cross-sectional view of a stack type flip-chip package according to the first embodiment of this invention. As shown in FIG. 2, major elements of a stack type flip-chip package 100 include a substrate board 110, a first chip 120, a second chip 130, an underfill material 170 and a packaging material 180. The substrate board 110 has a surface 112 with multiple line contacts 1141 and bump contacts 1142 thereon, wherein the line contacts 1141 are near the periphery of the substrate surface 112. The first chip 120 is disposed over the substrate board 110 covering the bump contacts 1142 but exposing the line contacts 1141, and has an active surface 122 with bonding pads 124 thereon facing the substrate surface 112. A bump 140 such as a solder bump or gold bump is attached to each bonding pad 124 on the first chip 120, so that each bonding pad 124 can be electrically connected with a corresponding bump contact 1142 on the substrate board 110 via a bump 140. The substrate board 110 may be a printed circuit board (PCB) such as a high-density fine pitch PCB or a flip-chip board or carrier.

Figure 3:
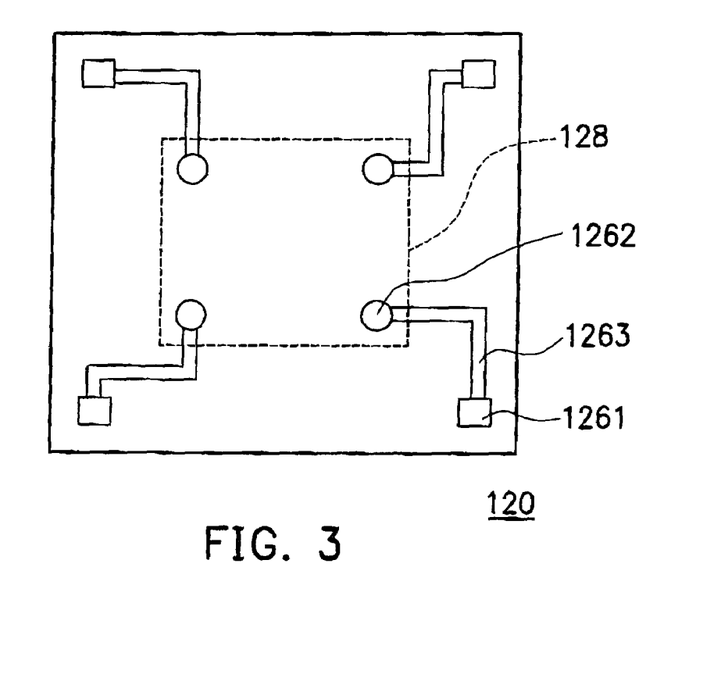
FIG. 3 is a top view of the first chip shown in FIG. 2.

The attachment of the bonding pads 134 on the active surface 132 of the second chip 130 onto the back surface 123 of the first chip 120 using a flip-chip technique is shown in greater detail in FIG. 3, which is a top view of the first chip shown in FIG. 2. The back surface 123 of the first chip 120 has a patterned redistribution circuit 126 including multiple line pads 1261 and bump pads 1262. A passivation layer 127 is further disposed covering the redistribution circuit 126 but exposing the line pads 1261 and the bump pads 1262, as shown in FIG. 2. Each bump pad 1262 fans out to a corresponding line pad 1261 through a circuit line 1263. The rectangular area enclosed by dash lines indicates a bump pad region 128, and the second chip 130 is positioned over the back surface 123 of the first chip 120 within the bump pad region 128.

The bonding pads 134 on the second chip 130 are attached with bumps 150, wherein each bump 150 is further attached to a corresponding bump pad 1262 in the redistribution circuit 126, so that the second chip 130 is electrically connected to the redistribution circuit 126 on the back surface 123 of the first chip 120. By conducting a wire-bonding operation, one end of a conductive wire 160 is attached to a line pad 1261 while the other end to a corresponding line contact 1141. Hence, the second chip 130 is electrically connected to the line contacts 1141 on the substrate board 110 through the bumps 150, the redistribution circuit 126 and the conductive wires 160. A circuit 116 may also be disposed within the substrate board 110 to connect a line contact 1141 with a bump contact 1142, so that the first chip 120 and the second chip 130 are electrically connected to each other.

The underfill material 170 fills up the space between the first chip 120 and the substrate board 110 and the gap between the first chip 120 and the second chip 130. The packaging material 180 encloses the first chip 120, the second chip 130 and the conductive wires 160, so that the bumps, the contacts, the bonding pads and the conductive wires are well protected within the package. If the first chip and the second chip have relatively small dimensions, the chips and conductive wires may be entirely enclosed by packaging material 180.

Figure 4:
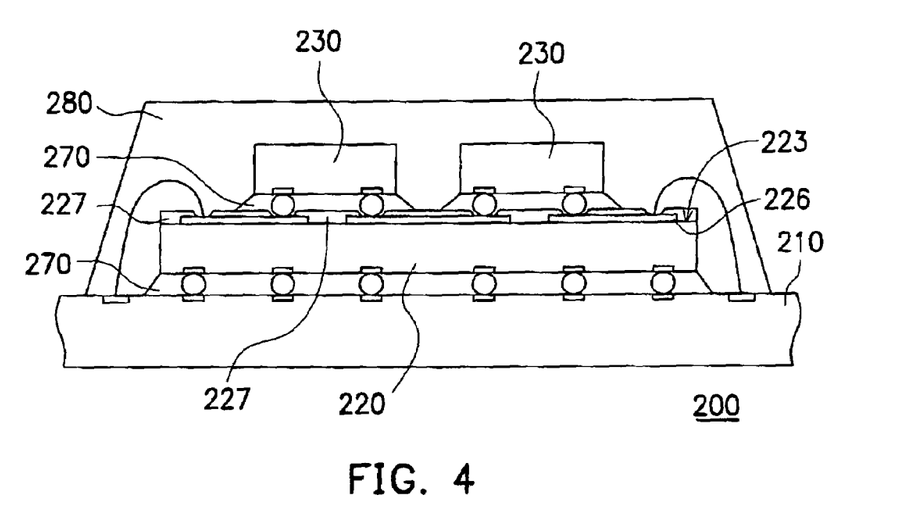
FIG. 4 is a schematic cross-sectional view of a stack type flip-chip package according to a second embodiment of this invention.

FIG. 4 is a schematic cross-sectional view of a stack type flip-chip package according to the second embodiment of this invention. One major difference from the first embodiment in FIG. 2 is that the stack type flip-chip package 200 in FIG. 4 has more than one second chips 230 on the back surface 223 of the first chip 220. Furthermore, different second chips 230 may be mutually connected through the redistribution circuit 226. A passivation layer 227 is further disposed covering the redistribution circuit 226 but exposing the line pads and the bump pads, as described above. As usual, a packaging material 280 is applied to enclose the first chip 220, the second chips 230 and the conductive wires.

Figure 5:
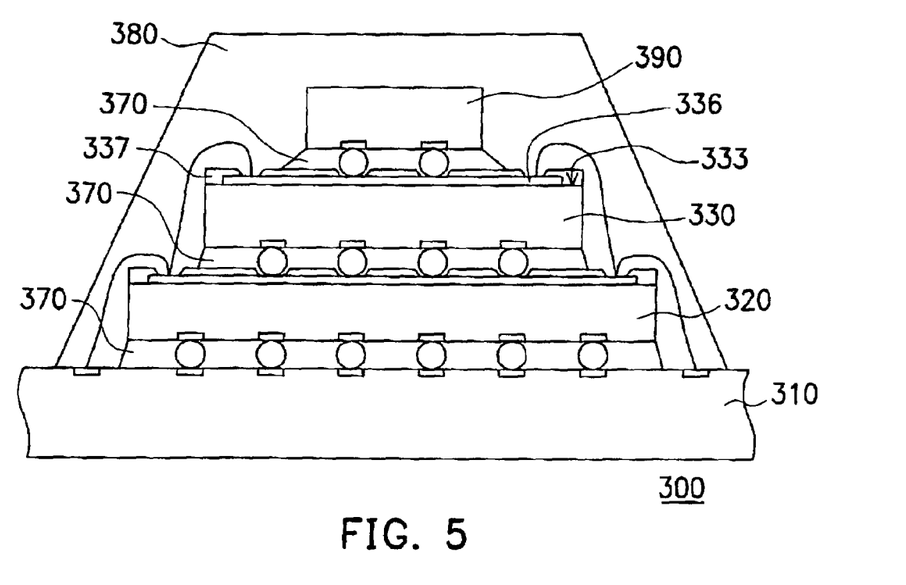
FIG. 5 is a schematic cross-sectional view of a stack type flip-chip package according to a third embodiment of this invention.

FIG. 5 is a schematic cross-sectional view of a stack type flip-chip package according to the third embodiment of this invention. One major difference from the first embodiment in FIG. 2 is that the stack type flip-chip package 300 in FIG. 5 has a redistribution circuit 336 on the back surface 333 of the second chip 330. A passivation layer 337 is further disposed covering the redistribution circuit 336 but exposing the line pads and the bump pads, as described above. Hence, a third chip 390 can be attached to the back surface 333 of the second chip 330 and electrically connected to the redistribution circuit 336 through wire bonding to form a three tiered structure. Note that the stack type flip-chip packages 200 and 300 as shown in FIGS. 4 and 5 can be combined to from a flip-chip package structure having different number of layers and different number of chips in each layer. As usual, a packaging material 380 is applied to enclose the first chip 320, the second chip 330, the third chip 390 and the conductive wires.

Figure 6:
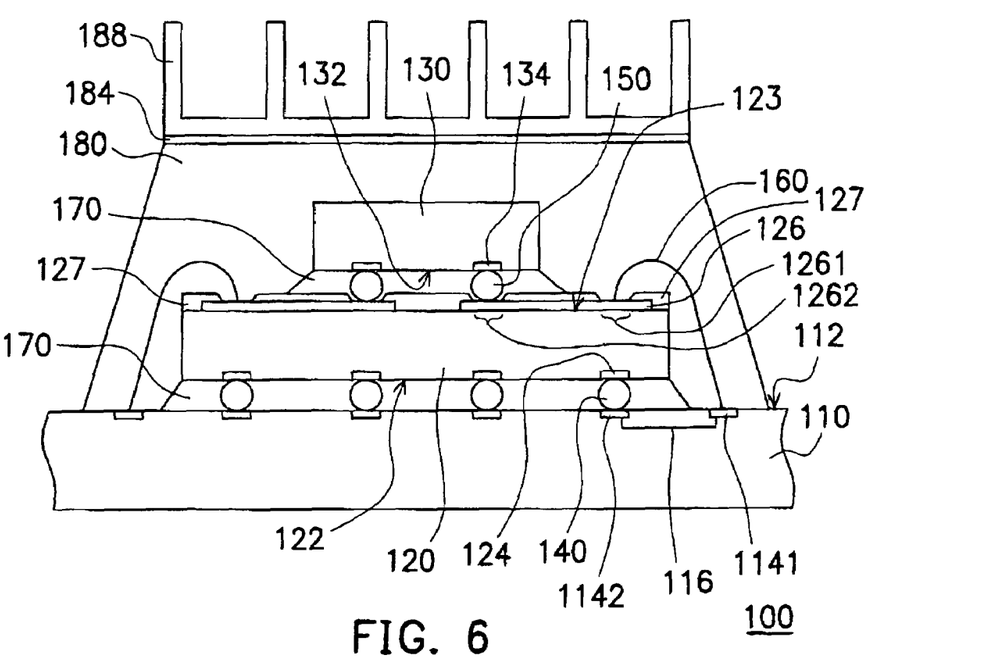
FIG. 6 is a schematic cross-sectional view of a stack type flip-chip package according to a fourth embodiment of this invention.

FIG. 6 is a schematic cross-sectional view of a stack type flip-chip package according to the fourth embodiment of this invention, which is similar to the above first embodiment in FIG. 2. The difference from the first embodiment is that a heat sink 188 is bonded to the packaging material 180 covering the back surface of the second chip 130 via an adhesive 184. The adhesive 184 may be an epoxy adhesive or a twin adhesive that has good thermal conductivity, and the heat sink 188 is for dissipating the heat generated in use of the chips.

Figure 7:
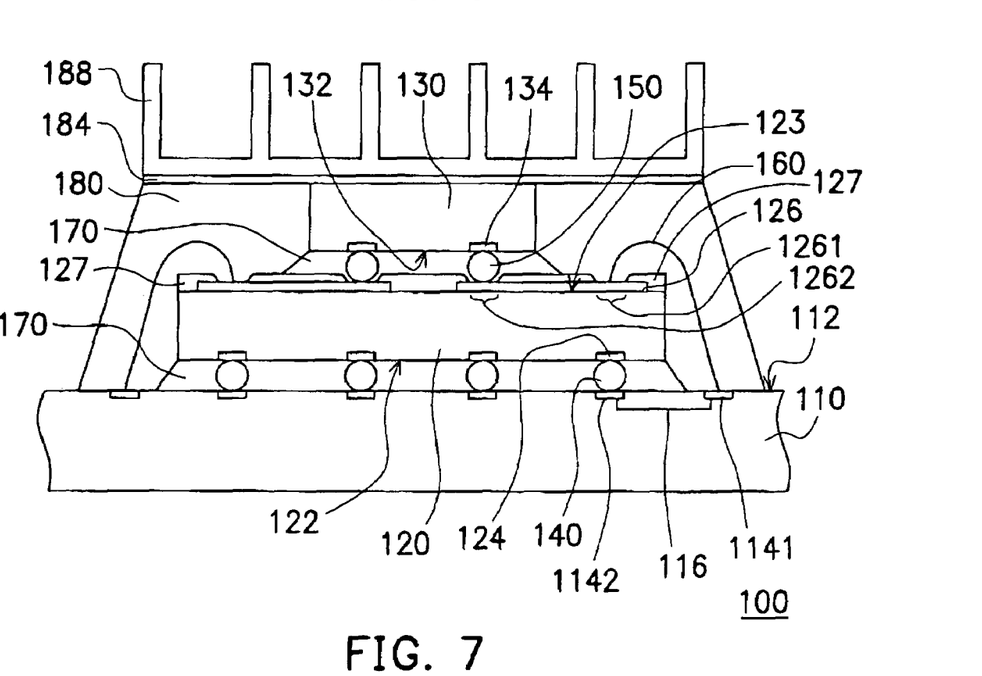
FIG. 7 is a schematic cross-sectional view of a stack type flip-chip package according to a fifth embodiment of this invention.

FIG. 7 is a schematic cross-sectional view of a stack type flip-chip package according to the fifth embodiment of this invention, which is similar to the above first embodiment in FIG. 2. The differences from the first embodiment are that the packaging material 180 does not enclose the second chip 130 but exposes the back surface of the second chip 130, onto which a heat sink 188 is directly bonded via an adhesive 184. The adhesive 184 may be an epoxy adhesive or a twin adhesive that has good thermal conductivity. With such a design, it is easier to dissipate the heat generated in use of the chips.

Figure 8:
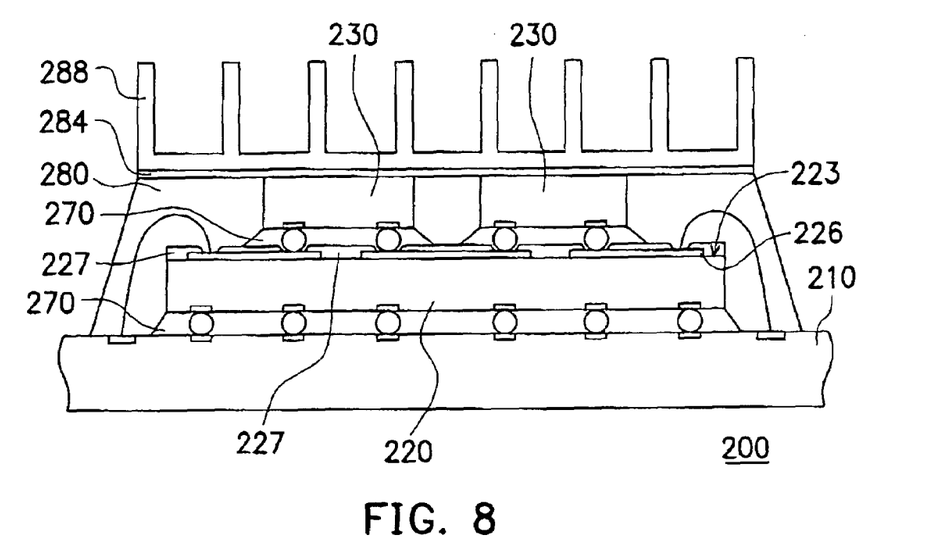
FIG. 8 is a schematic cross-sectional view of a stack type flip-chip package according to a sixth embodiment of this invention.

FIG. 8 is a schematic cross-sectional view of a stack type flip-chip package according to the sixth embodiment of this invention, which is similar to the above second embodiment in FIG. 4. The differences from the second embodiment are that the packaging material 280 does not enclose the second chips 230 but exposes the back surfaces of the second chips 230, onto which a heat sink 288 is directly bonded via an adhesive 284. With such a design, it is easier to dissipate the heat generated in use of the chips.

Figure 9:
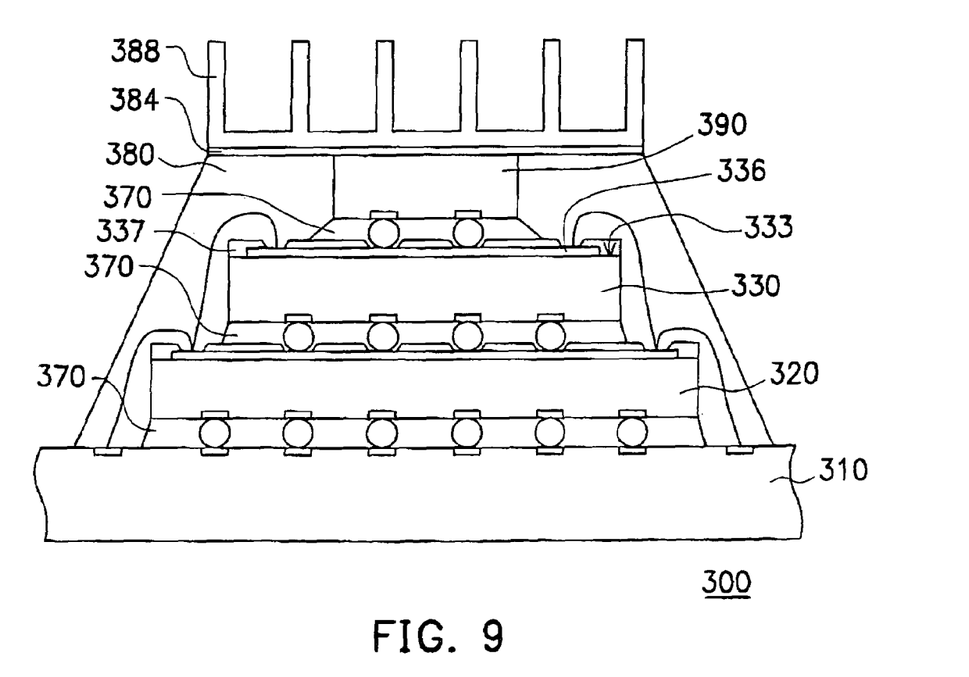
FIG. 9 is a schematic cross-sectional view of a stack type flip-chip package according to a seventh embodiment of this invention.

FIG. 9 is a schematic cross-sectional view of a stack type flip-chip package according to the seventh embodiment of this invention, which is similar to the above third embodiment in FIG. 5. The differences from the second embodiment are that the packaging material 380 does not enclose the upmost third chip 390 but exposes the back surface of the third chip 390, onto which a heat sink 388 is directly bonded via an adhesive 384. With such a design, it is easier to dissipate the heat generated in use of the chips.

Though the flip-chip electrical connections in the above embodiments 4–6 are established on use of the bump contacts, bump pads and bonding pads, they may be done with any other suitable method. Generally speaking, a stack type flip-chip package of this invention may include a substrate board having a circuit therein, multiple levels of stacked chips, multiple redistribution circuit layers and passivation layers, a packaging material and a heat sink. Each chip level includes at least one chip having an active surface and a back surface, wherein the active surface faces down and the back surface faces up, and the active surface of the at least one chip in the lowest level is electrically connected to the circuit in the substrate board. Each redistribution circuit layer is disposed on the back surface of a chip not in the upmost level, and is connected to the active surface of the at least one chip in an overlying level. The redistribution circuit layers of different levels are electrically connected through conductive wires, and the redistribution circuit layer on the at least one chip in the lowest level is electrically connected to the circuit in the substrate board also via conductive wires. Each passivation layer is disposed on the back surface of a chip not in the upmost level for protecting the redistribution circuit layer on the chip. The packaging material encloses the conductive wires and all of the chips not in the upmost level, but exposes the back surface of the at least one chip in the upmost level. The heat sink is directly bonded to the back surface of the at least one chip in the upmost level to facilitate thermal dissipation.

Figure 10:
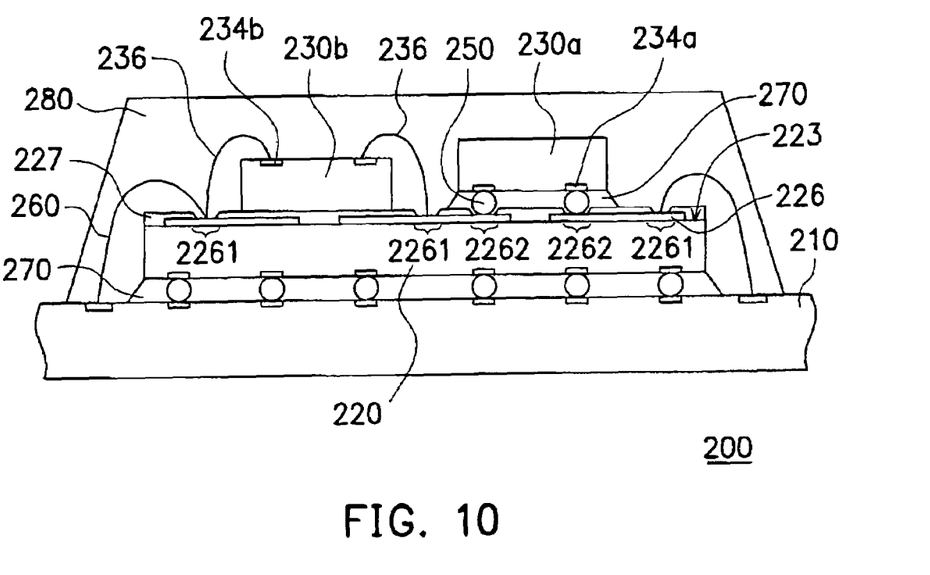
FIG. 10 is a schematic cross-sectional view of a stack type flip-chip package according to a eighth embodiment of this invention.

FIG. 10 is a schematic cross-sectional view of a stack type flip-chip package according to the eighth embodiment of this invention, which is similar to the above second embodiment in FIG. 4. The major difference from the second embodiment is that at least one second chip 230*b* is not flipped but faces the first chip 220 with its back surface. Since the active surface of the non-flipped second chip 230*b* faces up, the bonding pads 234*b* thereon are connected to a portion of the line pads 2261 via conductive wires 236. The line pads 2261 connected with the bonding pads 234*b* are connected with another portion of the line pads 2261 that are wire bonded to the substrate board 210, so that the non-flipped second chip 230*b* can be connected to the substrate board 210. The bonding pads 234*a* on the flipped second chip 230*a* are connected to the bump pads 2262 on the back surface 223 of the first chip 220 via bumps 250, as described above. In addition, the line pads 2261 connected with the bonding pads 234*b* may be further connected with a portion of the bump pads 2262, so that the non-flipped second chip 230*b* can be connected with the flipped second chip 230*a*.

Figure 11:
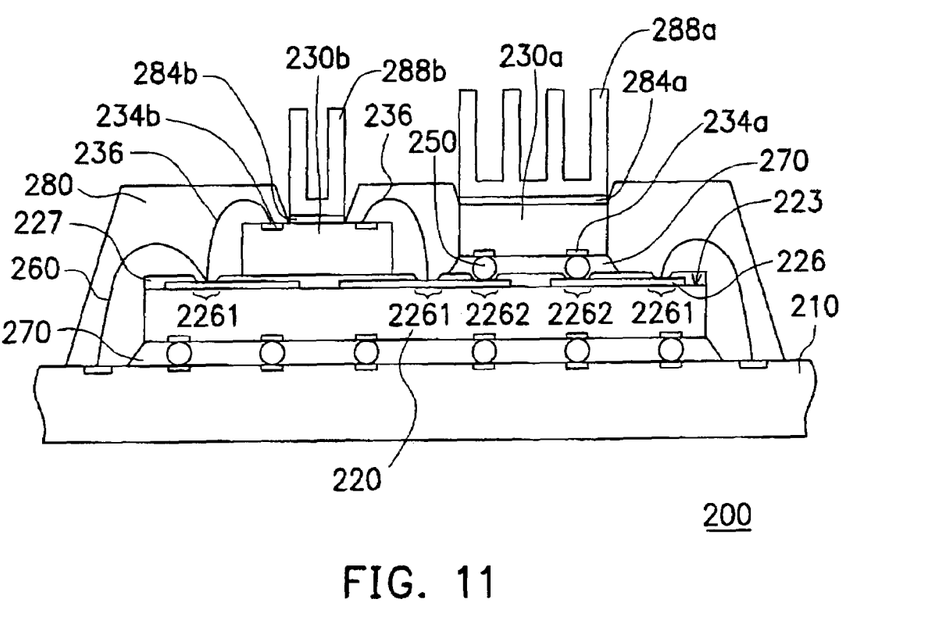
FIG. 11 is a schematic cross-sectional view of a stack type flip-chip package according to a ninth embodiment of this invention.

FIG. 11 is a schematic cross-sectional view of a stack type flip-chip package according to the ninth embodiment of this invention, which is similar to the above seventh embodiment in FIG. 9. The major difference from the seventh embodiment is that the packing material 280 does not enclose the second chips 230 but exposes a portion of the active surface of the non-flipped second chip 230*b* and the back surface of the flipped second chip 230*a*. A heat sink 288*b* is directly bonded to the exposed portion of the active surface of the non-flipped second chip 230*b* via an adhesive 284*b*, and another heat sink 288*a* is directly bonded to the back surface of the flipped second chip 230*a* via an adhesive 284*a*.

In conclusion, the stack type flip-chip package of this invention utilizes a redistribution circuit on the back surface of a flipped chip to serve as a bridge for connecting two or more chips each having a different function inside a single package. Wire bonding is employed to form necessary electrical connections between the redistribution circuit and contacts on the substrate board. Hence, an upper level chip may connect electrically with the substrate board or a lower level chip through the redistribution circuit and the conductive wires or a pair of upper level chips may connect electrically with each other through the redistribution circuit.

In addition, the stack type flip-chip design may also be applied to other packages including a pin grid array (PGA), a ball grid array (BGA) package or a direct chip array (DGA) package. Therefore, the flip-chip design not only facilitates the stacking of chips and the formation of a package over a printed circuit board, but also provides an easy means of connecting up chips on the package with contacts on the printed circuit board.

Moreover, the packaging material may expose the back surface(s) of the upmost chip(s) so that a heat sink can be directly bonded thereto to facilitate heat dissipation.

On the other hand, when there are multiple chips in the same level, at least one of the chips can be disposed non-flipped and connected to the underlying redistribution circuit through wire bonding, while each of the rest of the chips in the same level is disposed with bumps and flipped for electrical connection. Similarly, when the multiple chips are in the upmost level, the packaging material may expose a portion of the active surface of the non-flipped chip and the back surface of each of the rest of the chips in the same level, so that heat sinks can be directly bonded to the surfaces of the chips to facilitate heat dissipation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stack type flip-chip package, comprising:
    a substrate board having a plurality of bump contacts and line contacts thereon;
    a first chip having a first active surface and a back surface, wherein the first active surface faces the substrate board and has a plurality of first bonding pads thereon;
    a redistribution circuit layer on the back surface of the first chip, including a plurality of bump pads and line pads;
    a passivation layer on the back surface of the first chip, exposing the bump pads and the line pads of the redistribution circuit layer;
    a second chip disposed over the first chip, having a back surface and a second active surface with a plurality of second bonding pads thereon facing the first chip;
    a plurality of bumps, wherein a portion of the bumps are disposed between the bump contacts and the first bonding pads, and another portion of the bumps are disposed between the bump pads and the second bonding pads;
    a plurality of conductive wires that connect the line contacts and the line pads;
    a packaging material enclosing the first chip, the second chip and the conductive wires; and
    a heat sink bonded to the packing material covering the back surface of the second chip.

2. The stack type flip-chip package according to claim 1, further comprising an underfill material filling the space between the first chip and the substrate board and filling the gap between the first chip and the second chip.

3. The stack type flip-chip package according to claim 1, wherein the heat sink is bonded to the packaging material covering the back surface of the second chip via an adhesive.

4. A stack type flip-chip package, comprising:
    a substrate board having a plurality of bump contacts and line contacts thereon;
    a first chip having a first active surface and a back surface, wherein the first active surface faces the substrate board and has a plurality of first bonding pads thereon;
    a redistribution circuit layer on the back surface of the first chip, including a plurality of bump pads and line pads;
    a passivation layer on the back surface of the first chip, exposing the bump pads and the line pads of the redistribution circuit layer;
    a second chip disposed over the first chip, having a back surface and a second active surface with a plurality of second bonding pads thereon facing the first chip;
    a plurality of bumps, wherein a portion of the bumps are disposed between the bump contacts and the first bonding pads, and another portion of the bumps are disposed between the bump pads and the second bonding pads;
    a plurality of conductive wires that connect the line contacts and the line pads;
    a packaging material enclosing the first chip and the conductive wires but exposing the back surface of the second chip; and
    a heat sink bonded to the back surface of the second chip.

5. The stack type flip-chip package according to claim 4, further comprising an underfill material filling the space between the first chip and the substrate board and filling the gap between the first chip and the second chip.

6. The stack type flip-chip package according to claim 4, wherein the heat sink is bonded to the back surface of the second chip via an adhesive.

7. A stack type flip-chip package, comprising:
    a substrate board having a plurality of bump contacts and line contacts thereon;
    a first chip having a first active surface and a back surface, wherein the first active surface faces the substrate board and has a plurality of first bonding pads thereon;
    a redistribution circuit layer on the back surface of the first chip, including a plurality of bump pads and line pads;
    a passivation layer on the back surface of the first chip, exposing the bump pads and the line pads of the redistribution circuit layer;
    a plurality of second chips disposed over the first chip, each having a back surface and a second active surface with a plurality of second bonding pads thereon facing the first chip;
    a plurality of bumps, wherein a portion of the bumps are disposed between the bump contacts and the first bonding pads and another portion of the bumps are disposed between the bump pads and the second bonding pads;
    a plurality of conductive wires for connecting the line contacts and the line pads;
    a packaging material enclosing the first chip and the conductive wires but exposing the back surfaces of the second chips; and
    a heat sink bonded to the back surfaces of the second chips.

8. The stack type flip-chip package according to claim 7, further comprising an underfill material filling the space between the first chip and the substrate board and filling the gaps between the first chip and the second chips.

9. The stack type flip-chip package according to claim 7, wherein the heat sink is bonded to the back surfaces of the second chips via an adhesive.

10. A stack type flip-chip package, comprising:
    a substrate board having a plurality of bump contacts and line contacts thereon;
    a first chip having a first active surface and a back surface, wherein the first active surface faces the substrate board and has a plurality of first bonding pads thereon;
    a first redistribution circuit layer on the back surface of the first chip, including a plurality of first bump pads and first line pads;
    a first passivation layer on the back surface of the first chip, exposing the first bump pads and the first line pads of the first redistribution circuit layer;
    at least one second chip disposed over the first chip, having a second back surface and a second active surface with a plurality of second bonding pads thereon facing the first chip;
    a second redistribution circuit layer on the second back surface of the at least one second chip, including a plurality of second bump pads and second line pads;

a second passivation layer on the second back surface of the at least one second chip, exposing the second bump pads and the second line pads of the second redistribution circuit layer;

at least one third chip disposed over the at least one second chip, having a third back surface and a third active surface with a plurality of third bonding pads thereon facing the at least one second chip;

a plurality of bumps disposed between the bump contacts and the first bonding pads, between the second bonding pads and the first bump pads, and between the second bump pads and the third bonding pads;

a plurality of conductive wires for connecting the line contacts and the first line pads, and for connecting the second line pads and the first line pads;

a packaging material enclosing the first chip, the second chip and the conductive wires but exposing the third back surface of the third chip; and a heat sink bonded to the third back surface of the third chip.

11. The stack type flip-chip package according to claim 10, further comprising an underfill material filling the space between the first chip and the substrate board, filling the gap between the first chip and the at least one second chip, and filling the gap between the at least one second chip and the third chip.

12. The stack type flip-chip package according to claim 10, wherein the heat sink is bonded to the back surface of the third chip via an adhesive.

13. A stack type flip-chip package, comprising:
a substrate board having a plurality of bump contacts and line contacts thereon;
a first chip having a first active surface and a first back surface, wherein the first active surface faces the substrate board and has a plurality of first bonding pads thereon;
a redistribution circuit layer on the back surface of the first chip, including a plurality of bump pads and line pads;
a passivation layer on the back surface of the first chip, exposing the bump pads and the line pads of the redistribution circuit layer;
a plurality of second chips disposed over the first chip, each having a second back surface and a second active surface with a plurality of second bonding pads thereon, wherein at least one second chip is non-flipped and disposed with its back surface facing the first chip, and each of the rest of the second chips is flipped and disposed with its active surface facing the first chip;
a plurality of bumps, wherein a portion of the bumps are disposed between the bump contacts and the first bonding pads and another portion of the bumps are disposed between the bump pads and the second bonding pads facing the first chip;
a plurality of conductive wires, wherein a portion of the conductive wires connect the line contacts and a portion of the line pads and another portion of the conductive wires connect the bonding pads of the at least one non-flipped second chip and another portion of the line pads; and
a packaging material enclosing the first chip, the second chips and the conductive wires.

14. The stack type flip-chip package according to claim 13, further comprising an underfill material filling the space between the first chip and the substrate board and filling the gap between the first chip and each of the second chips except the at least one non-flipped second chip.

15. A stack type flip-chip package, comprising:
a substrate board having a plurality of bump contacts and line contacts thereon;
a first chip having a first active surface and a first back surface, wherein the first active surface faces the substrate board and has a plurality of first bonding pads thereon;
a redistribution circuit layer on the first back surface of the first chip, including a plurality of bump pads and line pads;
a passivation layer on the first back surface of the first chip, exposing the bump pads and the line pads of the redistribution circuit layer;
a plurality of second chips disposed over the first chip, each having a second back surface and a second active surface with a plurality of second bonding pads thereon, wherein at least one second chip is non-flipped and disposed with its back surface facing the first chip, and each of the rest of the second chips is flipped and disposed with its active surface facing the first chip;
a plurality of bumps, wherein a portion of the bumps are disposed between the bump contacts and the first bonding pads and another portion of the bumps are disposed between the bump pads and the second bonding pads facing the first chip;
a plurality of conductive wires for connecting the line contacts and the line pads, and for connecting the second bonding pads of the at least one non-flipped second chip and the line pads;
a packaging material enclosing the first chip and the conductive wires but exposing a portion of the active surface of the at least one non-flipped second chip and the back surface of each of the rest of the second chips; and
a plurality of heat sinks, bonded to the exposed active surface of the at least one non-flipped second chip and the back surface of each of the rest of the second chips.

16. The stack type flip-chip package according to claim 15, further comprising an underfill material filling the space between the first chip and the substrate board and filling the gaps between the first chip and each of the second chips except the at least one non-flipped second chip.

17. The stack type flip-chip package according to claim 15, wherein the heat sinks are bonded to the exposed active surface of the at least one non-flipped second chip and the back surface of each of the rest of the second chips via an adhesive.

18. A stack type flip-chip package, comprising:
a substrate board having a circuit therein;
multiple levels of stacked chips, wherein each level includes at least one chip having an active surface and a back surface, wherein the active surface of each chip faces down and the back surface of each chip faces up, and the active surface of the at least one chip in a lowest level is electrically connected to the circuit in the substrate board;
a plurality of redistribution circuit layers, each distribution circuit layer includes a plurality of bumpads and line pads, each of which is disposed on the back surface of a chip not in an upmost level and is electrically connected to the active surface of the at least one chip in an overlying level, wherein the redistribution circuit layers of different levels are electrically connected through conductive wires, and the redistribution circuit layer on the at least one chip in the lowest level is electrically connected to the circuit in the substrate board also via conductive wires;

a plurality of passivation layers, each of which is disposed on the back surface of a chip not in the upmost level for protecting the redistribution circuit layer on the chip exposing the plurality of bump pads and line pads of the redistribution circuit layer;

a packaging material enclosing the conductive wires and all of the chips not in the upmost level but exposing the back surface of the at least one chip in the upmost level; and a heat sink bonded to the back surface of the at least one chip in the upmost level.

19. The stack type flip-chip package according to claim 18, wherein the heat sink is bonded to the back surface of the at least one chip in the upmost level via an adhesive.

20. The stack type flip-chip package according to claim 18, wherein the circuit in the substrate board includes a plurality of line contacts and bump contacts;

the active surface of each chip has a plurality of bonding pads thereon;

the bonding pads of the at least one chip in the lowest level are electrically connected to the bump contacts via bumps;

wherein the bump pads are electrically connected with the bonding pads on the active surface of the at least one chip in an overlying level via bumps;

the line contacts on the substrate and the line pads of the redistribution circuit layer on the at least one chip in the lowest level are connected via a portion of the conductive wires; and the line pads of the redistribution circuit layers on the chips of different levels are connected via another portion of the conductive wires.

* * * * *